United States Patent
Lai et al.

(10) Patent No.: US 6,620,693 B2
(45) Date of Patent: Sep. 16, 2003

(54) NON-VOLATILE MEMORY AND FABRICATION THEREOF

(75) Inventors: Han-Chao Lai, Taichung (TW); Hung-Sui Lin, Hsin-Ying (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/055,491

(22) Filed: Jan. 22, 2002

(65) Prior Publication Data

US 2003/0134478 A1 Jul. 17, 2003

(30) Foreign Application Priority Data

Jan. 16, 2002 (TW) .......................................... 91100553 A

(51) Int. Cl.$^7$ ......................................... H01L 21/8234
(52) U.S. Cl. ...................... 438/275; 438/276; 438/288
(58) Field of Search ................................ 438/275, 276, 438/288

(56) References Cited

U.S. PATENT DOCUMENTS

| | | | |
|---|---|---|---|
| 4,992,390 A | * | 2/1991 | Chang .......................... 438/270 |
| 5,595,927 A | * | 1/1997 | Chen et al. .................. 438/270 |
| 5,627,091 A | * | 5/1997 | Hong .......................... 438/276 |
| 5,895,242 A | * | 4/1999 | Wen ...................... 257/29.294 |
| 6,303,436 B1 | * | 10/2001 | Sung .......................... 438/257 |
| 6,350,654 B1 | * | 2/2002 | Sheu et al. .................. 438/278 |
| 6,448,112 B2 | * | 9/2002 | Lee ............................ 438/128 |

* cited by examiner

*Primary Examiner*—Richard Booth
(74) *Attorney, Agent, or Firm*—J. C. Patents

(57) ABSTRACT

A method for fabricating a non-volatile memory is described. A planar doped region is formed in the substrate at first. A mask layer and a patterned photoresist layer are sequentially formed on the substrate. A plurality of trenches is formed in the substrate with the patterned photoresist layer as a mask to divide the planar doped region into a plurality of bit-lines. The patterned photoresist layer is removed and then a recovering process is performed to recover the side-walls and the bottoms of the trenches from the damages caused by the trench etching step; The mask layer is removed. A dielectric layer is formed on the substrate and then a plurality of word-lines is formed on the dielectric layer.

7 Claims, 4 Drawing Sheets

NON-VOLATILE MEMORY AND FABRICATION THEREOF

CROSS-REFERENCE TO RELATED APPLICATION

This application claims the priority benefit of Taiwan application serial no. 91100553, filed Jan. 16, 2002.

BACKGROUND OF THE INVENTION

1. Field of Invention

The present invention relates to a structure of a semiconductor memory device and the fabrication thereof. More particularly, the present invention relates to a structure of a non-volatile memory and the fabrication thereof.

2. Description of Related Art

Non-volatile memory is widely used to store booting information in personal computers and in various electronic apparatuses since the data stored in a non-volatile memory does not disappear when the power is turned off.

In the family of non-volatile memory, the simplest one is namely the mask read-only memory (Mask ROM). A Mask ROM uses a MOS transistor as a memory cell and is programmed by implanting ions into the channels of selected memory cells to alter their threshold voltages and thereby to control their logic states (0/1). A Mask ROM cell comprises a substrate, two bit-lines, a polysilicon word-line crossing over the bit-lines and a channel region in the substrate under the word-line and between the bit-lines. The channel region represents a logic state "0" or"1" dependent on the presence or absence of the ions implanted.

Another type of non-volatile memory is the well-known electrically erasable programmable read-only memory ($E^2$PROM), which conventionally comprises a floating gate and a control gate both made from polysilicon. When an $E^2$PROM is being programmed or erased, appropriate biases are applied to the control gate and to the source/region to inject charges into the floating gate or to drive out charges from the floating gate. However, if there are defects in the tunnel oxide layer under the floating gate in a conventional flash memory, a leakage easily occurs in the memory cell and the reliability of the device is thus lowered.

To solve the leakage problem of a flash memory, a nitride charge-trapping layer is recently used to replace the polysilicon floating gate in the conventional flash memory. The nitride charge-trapping layer is usually disposed between two silicon oxide layers to form an oxide/nitride/oxide (ONO) composite layer, while the memory with a nitride charge-trapping layer is known as a "nitride read-only memory (NROM)". In a NROM, the nitride charge-trapping layer is able to trap electrons so that the injected hot electrons do not distribute evenly in the charge-trapping layer, but are localized in a region of the charge-trapping layer near the drain with a Gaussian spatial distribution. Because the injected electrons are localized, the charge-trapping region is small and is less likely to locate on the defects of the tunnel oxide layer. A leakage therefore does not easily occur in the device. Moreover, since the electrons are localized in a region of the charge-trapping layer near the drain, the NROM is capable of storing two bits in one memory-cell. This is achieved by changing the direction of the current in the channel and thus varying the generating site and the injecting region of the hot electrons. Thus, a memory cell can be configured one of the four states, in which each of the two ends of the charge-trapping layer may have one group of electrons with a Gaussian spatial distribution or have zero electron trapped in it.

However, when the non-volatile memory device is scaled down, the width of the bit-line of the non-volatile memory is also decreased. Therefore, the resistance of the bit-line becomes higher, which means that the "bit-line loading" is higher.

To lower the resistance of the bit-line, a deeper junction or a higher dopant concentration is adopted in the prior art. However, a deeper junction will cause a severer short channel effect (SCE) and a larger punch-through leakage, and the dopant concentration of the bit-line is restricted by the solid-state solubility of the dopants. Therefore, miniaturizing the non-volatile memory device is still not easy.

SUMMARY OF THE INVENTION

Accordingly, this invention provides a non-volatile memory and the fabrication thereof to lower the bit-line loading in a miniaturized memory device.

To fabricate the non-volatile memory of this invention, a planar doped region is formed in a substrate. A mask layer and a patterned photoresist layer are sequentially formed on the substrate. A plurality of trenches are formed in the substrate with the photoresist layer as a mask to divide the planar doped region into a plurality of buried bit-lines. The photoresist layer is removed and then a recovering process may be performed to recover the side-walls and the bottoms of the trenches from the damages caused by the trench etching step. The mask layer is removed. A dielectric layer is formed on the substrate and then a plurality of word-lines are formed on the dielectric layer.

This invention also provides a method for fabricating a Mask ROM. In this method, a plurality of buried bit-lines and a plurality of word-lines are fabricated by the same method described above, and a gate dielectric layer is formed under the word-lines, while a portion of the substrate under the word-lines and between the buried bit-lines serves as a plurality of coding regions. Thereafter, a coding mask not covering selected coding regions is formed over the substrate and then a coding implantation is performed with the coding mask as a mask.

This invention also provides a method for fabricating a nitride read-only memory (NROM). In this method, a plurality of buried bit-lines and a plurality of word-lines are fabricated by the same method described above, but a charge trapping layer, instead of the (gate) dielectric layer mentioned above, is formed under the word-lines.

This invention further provides a non-volatile memory, which comprises a substrate, a plurality of buried bit-lines, a plurality of word-lines, and a dielectric layer. The buried bit-lines are located in the substrate and are separated by a plurality of isolating structures. The word-lines are disposed on a portion of the substrate and the isolating structures and cross over the isolating structures and the buried bit-lines. The dielectric layer is between the substrate and the word-lines. The isolating structures may comprise trenches.

In the method of fabricating a non-volatile memory, a Mask ROM or a NROM of this invention, the recovering process is used to rearrange the distorted lattice of the substrate caused by the etching process for forming the trenches. Consequently, the defects in the channel regions are reduced and a leakage is prevented.

Since the buried bit-lines are separated by the trenches, a deeper junction can be formed to lower the resistance of the buried bit-lines and thereby to lower the bit-line loading without adversely augmenting the short channel effect and the punch-through leakage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

First Embodiment

In the first embodiment of this invention, a Mask ROM structure and the fabrication thereof are described.

Figure 1A:
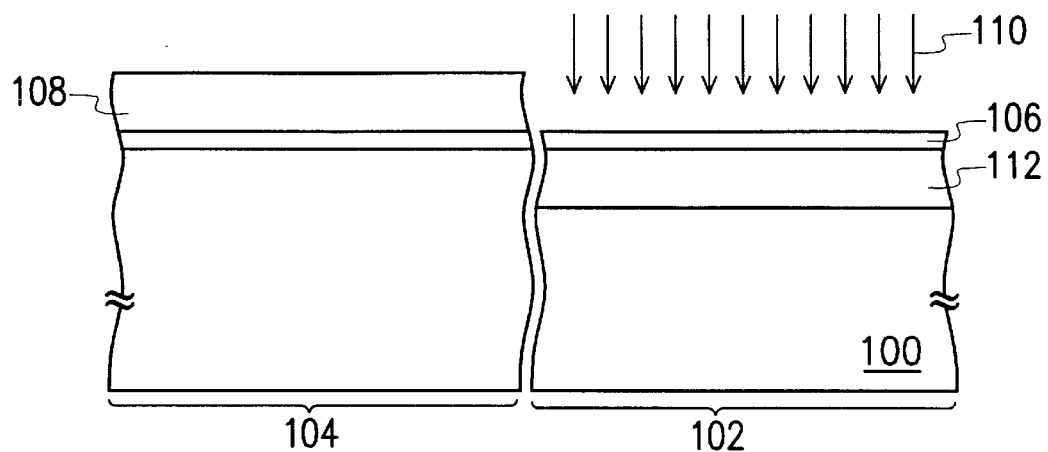
FIGS. 1A~1F illustrate the process flow of fabricating a Mask ROM according to the first preferred embodiment of this invention.

Refer to FIG. 1A, a substrate 100, such as a P-type silicon substrate, is provided. The substrate 100 is partitioned into a memory region 102 and a periphery region 104.

A sacrificial layer 106 is formed on the substrate 100. The sacrificial layer 106 comprises, for example, silicon oxide and has a thickness, for example, from about 50 Å to about 100 Å, and is formed by a method such as chemical vapor deposition (CVD)

A patterned photoresist layer 108 is formed on the substrate 100 to cover the periphery region 104. An ion implantation 110 is then performed to dope the substrate 100 exposed by the photoresist layer 108 to form a planar doped region 112, wherein the implanted ions are, for example, N-type ions.

Figure 1B:
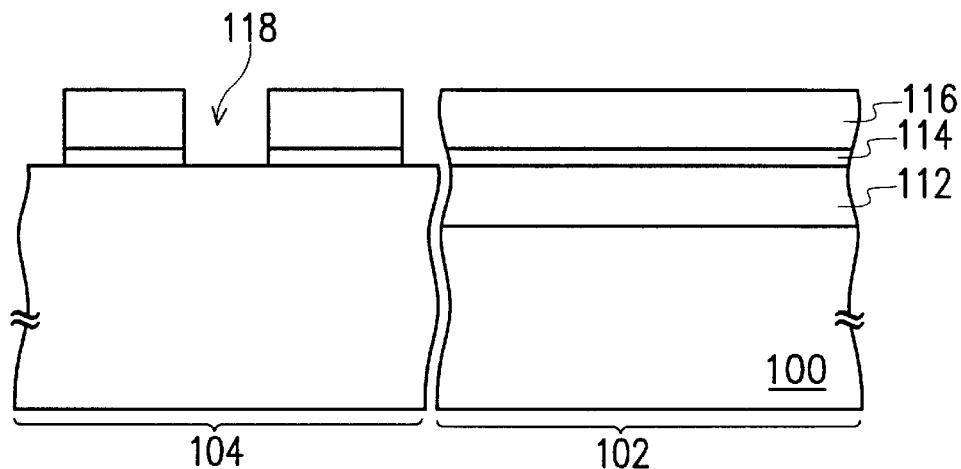

Refer to FIG. 1B, the photoresist layer 108 and the sacrificial layer 106 (FIG. 1A) are removed and then a pad oxide layer 114 and a mask layer 116 are sequentially formed on the substrate 100. The pad oxide layer 114 has a thickness of, for example, from about 30 Å to about 60 Å and is formed by, for example, thermal oxidation or chemical vapor deposition (CVD). The mask layer 116 comprises, for example, silicon nitride and is formed by, for example, chemical vapor deposition (CVD).

A lithography process and an etching process are then performed to pattern the mask layer 116 and the pad oxide layer 114 to form a plurality of openings 118 in the mask layer 116 and the pad oxide layer 114 on the periphery region 104.

Figure 1C:
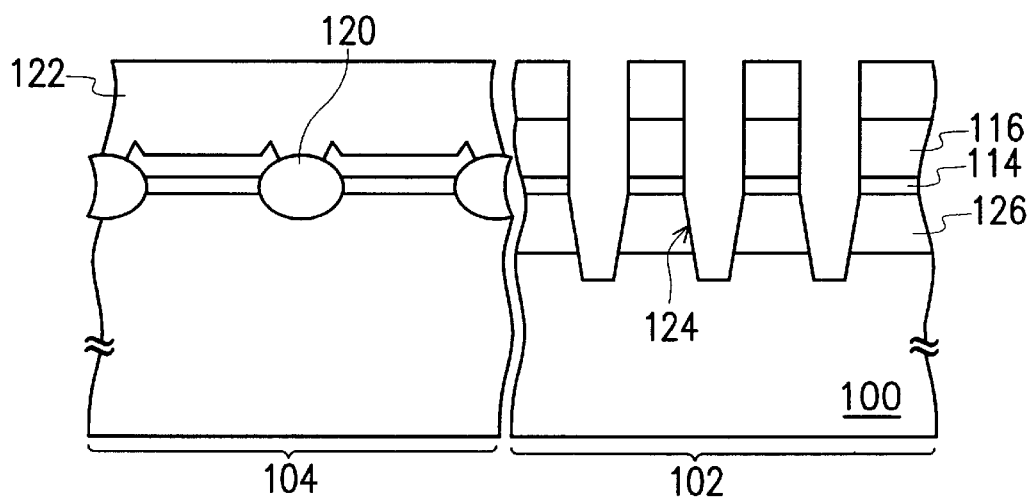

Refer to FIG. 1C, a field oxide layer 120 is formed on the substrate 100 exposed by the opening 118 by thermal oxidation.

A patterned photoresist 122, which covers the periphery region 104 but exposes a portion of the memory region 102, is then formed over the substrate 100. By using the photoresist layer 122 as a mask, the mask layer 116, the pad oxide layer 114 and the substrate 100 are etched sequentially to form a plurality of trenches 124. The bottom of the trench 124 is lower than that of the planar doped region 112, so that the planar doped region 112 is divided into a plurality of buried bit-lines 126. In additional, a portion of the bottom of one trench 124 serves as a plurality of coding regions arranged in a direction that projects out from the paper (not shown).

Figure 1D:
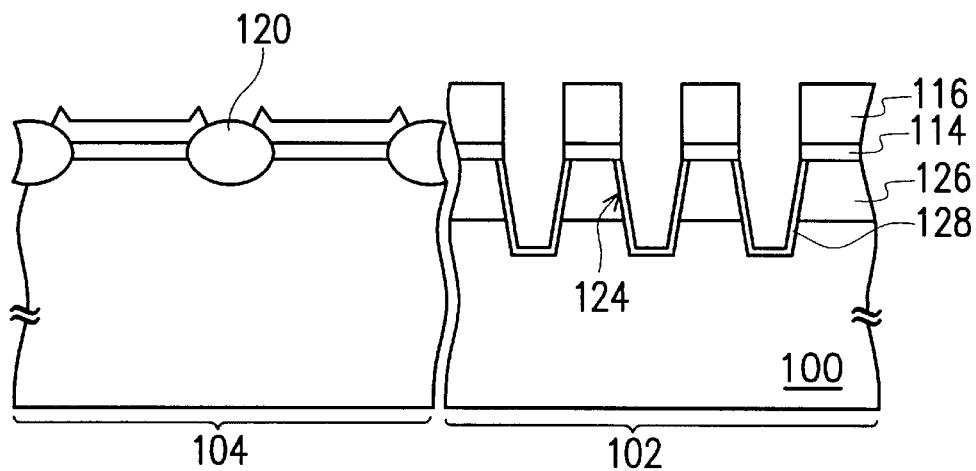

Refer to FIG. 1D, the patterned photoresist layer 122 is removed. A thermal oxidation is then performed to form a liner oxide layer 128 on the exposed surface of the trench 124 with the mask layer 116 as a mask, so as to decrease the defects therein caused by the etching process of the trench 124.

Figure 1E:
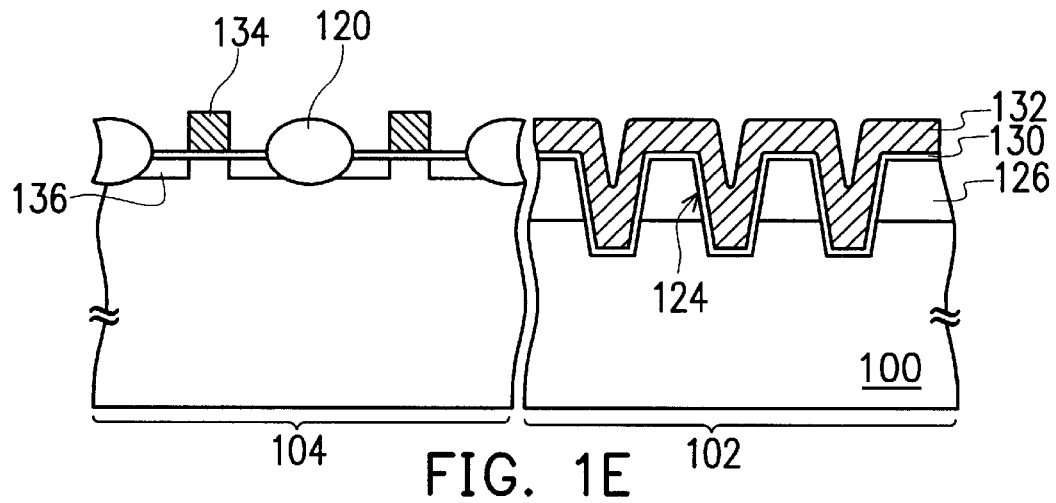

Refer to FIG. 1E, the liner oxide layer 128, the mask layer 116 and the pad oxide layer 114 are removed and then a gate dielectric layer 130 is formed on the substrate 100. The gate dielectric layer 130 comprises, for example, silicon oxide and is formed by a method such as thermal oxidation.

A conductive layer (not shown) is then formed on the substrate 100. The conductive layer comprises, for example, polysilicon and is formed by, for example, chemical vapor deposition (CVD) with in-situ doping. A lithography process and an etching process are performed to pattern the conductive layer into a plurality of word-lines 132 on the memory region 102 and a plurality of gates 134 on the periphery region 104. Thereafter, a source/drain region 136 is formed in the substrate 100 beside the gate 134 on the periphery region 104.

Figure 1F:
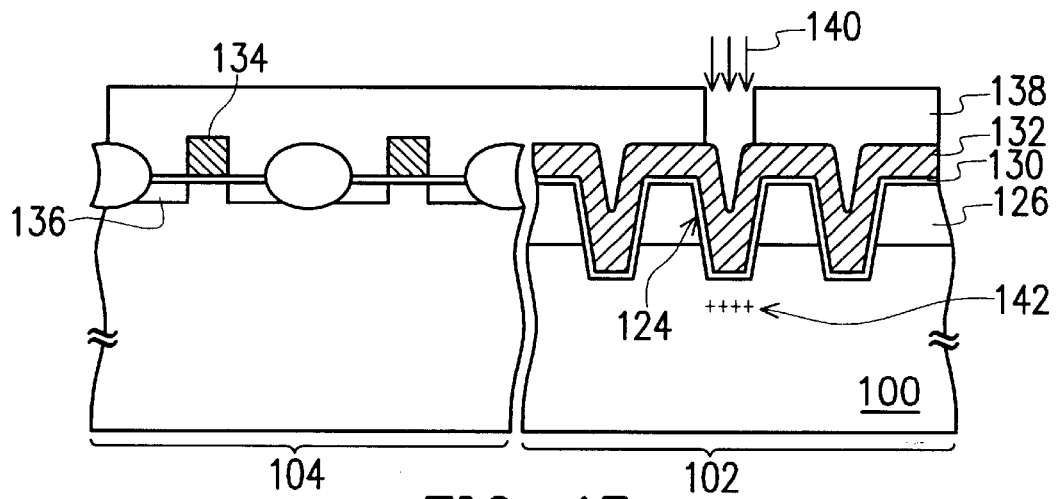

Refer to FIG. 1F, a coding process is performed to program the Mask ROM with the following steps. A patterned photoresist layer 138, which does not cover a selected coding region, is formed over the substrate 100 by using a photo-mask. An ion implantation 140 is performed to implant ions into the selected coding region with the photoresist layer 138 as a mask. The subsequent back-end process is well-known by those skilled in the art and will not be described here.

In the method of the first embodiment of this invention, the distorted lattice of the substrate 100 is rearranged with a thermal oxidation process after the trench 124 is formed and after the photoresist layer 122 is removed. The defects in the channel regions thus are decreased and a leakage is prevented.

Moreover, this invention sets the coding regions at the bottom of the trench 124 and selectively implants ions therein to set the selected channels to an "Off" state during a reading operation.

Since the buried bit-lines 126 are separated by the trenches 124, a deeper junction can be formed to lower the resistance of the buried bit-lines and thereby to lower the bit-line loading without adversely augmenting the short channel effect and the punch-through leakage.

Second Embodiment

In the second embodiment of this invention, a NROM structure and the fabrication thereof are described.

Figure 2A:
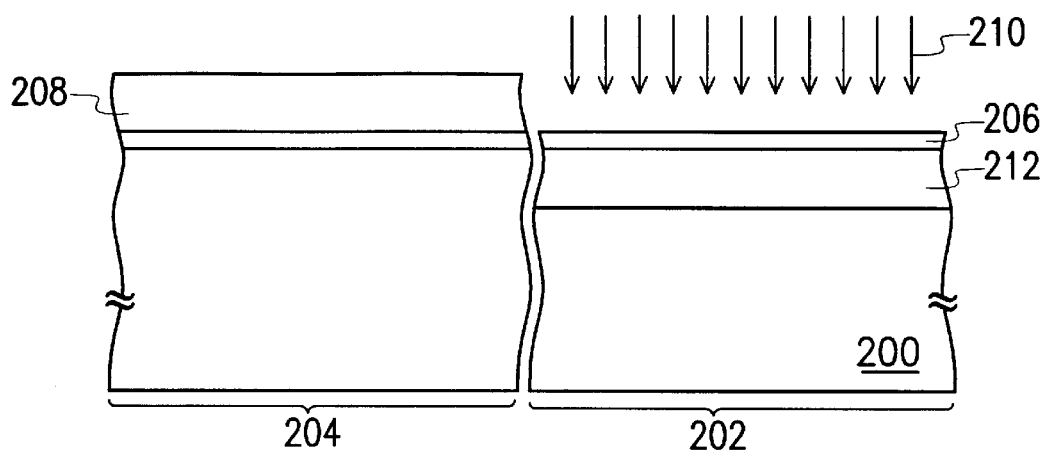
FIGS. 2A~2F illustrate the process flow of fabricating a NROM according to the second preferred embodiment of this invention.

Refer to FIG. 2A, a substrate 200, such as a P-type silicon substrate, is provided. The substrate 200 is partitioned into a memory region 202 and a periphery region 204.

A sacrificial layer 206 is formed on the substrate 200. The sacrificial layer 206 comprises, for example, silicon oxide and has a thickness, for example, from about 50 Å to about 100 Å, and is formed by a method such as chemical vapor deposition (CVD)

A patterned photoresist layer 208 is formed on the substrate 200 to cover the periphery region 204. An ion implantation 210 is then performed to dope the substrate 200 that is exposed by the photoresist layer 208 to form a planar doped region 212, wherein the implanted ions are, for example, N-type ions.

Figure 2B:
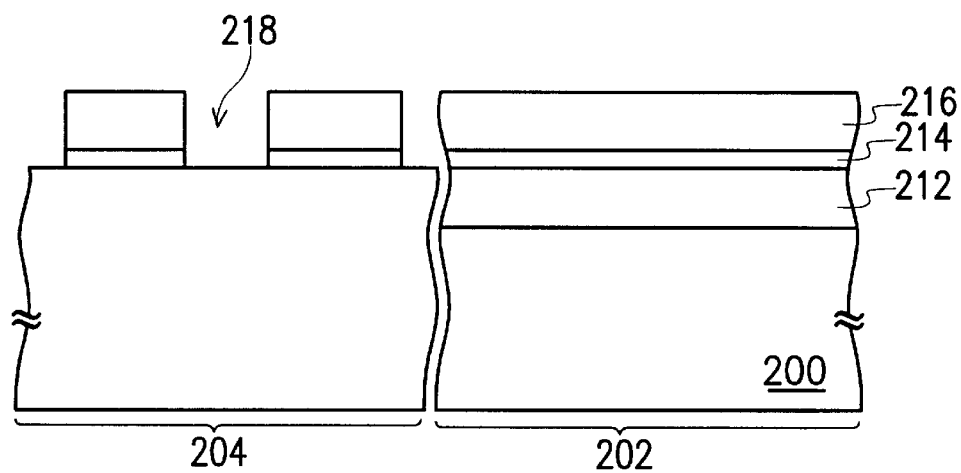

Refer to FIG. 2B, the photoresist layer 208 and the sacrificial layer 206 (FIG. 2A) are removed and then a pad oxide layer 214 and a mask layer 216 are sequentially formed on the substrate 200. The pad oxide layer 214 has a thickness, for example, from about 30 Å to about 60 Å and is formed by a method such as thermal oxidation or chemical vapor deposition (CVD). The mask layer 216 comprises, for example, silicon nitride and is formed by, for example, chemical vapor deposition (CVD).

A lithography process and an etching process are then performed to pattern the mask layer 216 and the pad oxide layer 214 to form a plurality of openings 218 in the mask layer 216 and in the pad oxide layer 214 on the periphery region 204.

Figure 2C:
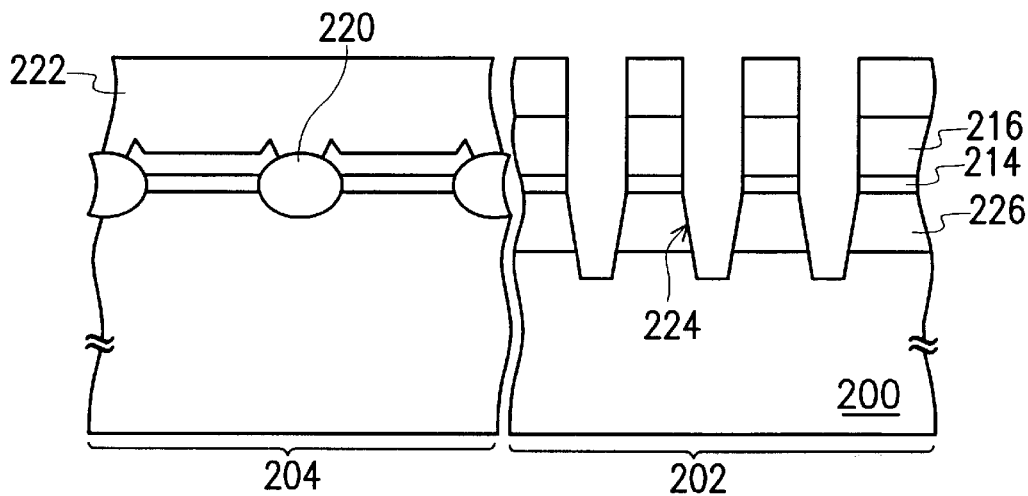

Refer to FIG. 2C, a field oxide layer 220 is formed on the substrate 200 that is exposed by the opening 218 by thermal oxidation.

A patterned photoresist 222, which covers the periphery region 204 but exposes a portion of the memory region 202, is then formed over the substrate 200. By using the photoresist layer 222 as a mask, the mask layer 216, the pad oxide layer 214 and the substrate 200 are etched sequentially to form a plurality of trenches 224. The bottom of the trench 224 is lower than that of the planar doped region 212, so that the planar doped region 212 is divided into a plurality of buried bit-lines 226.

Figure 2D:
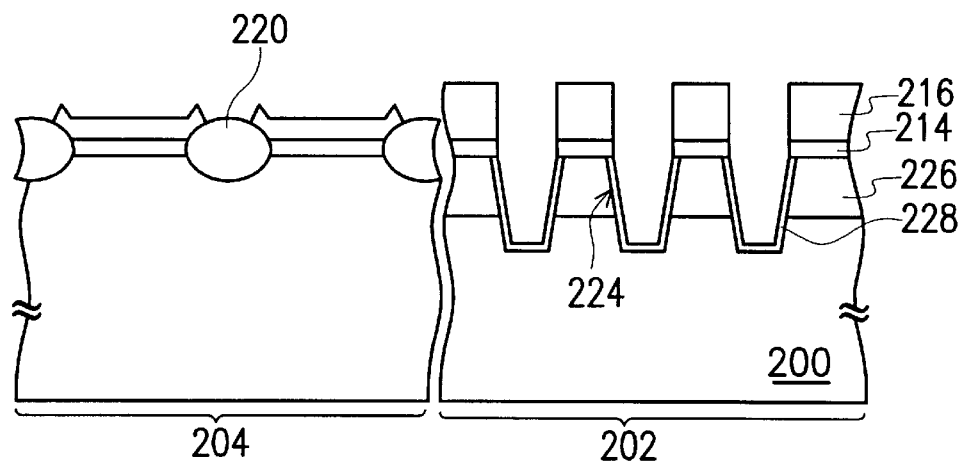

Refer to FIG. 2D, the photoresist layer 222 is removed. A thermal oxidation is then performed to form a liner oxide layer 228 on the exposed surfaces of the trenches 224 with the mask layer 216 as a mask, so as to decrease the defects therein caused by the etching process of the trench 224.

Figure 2E:
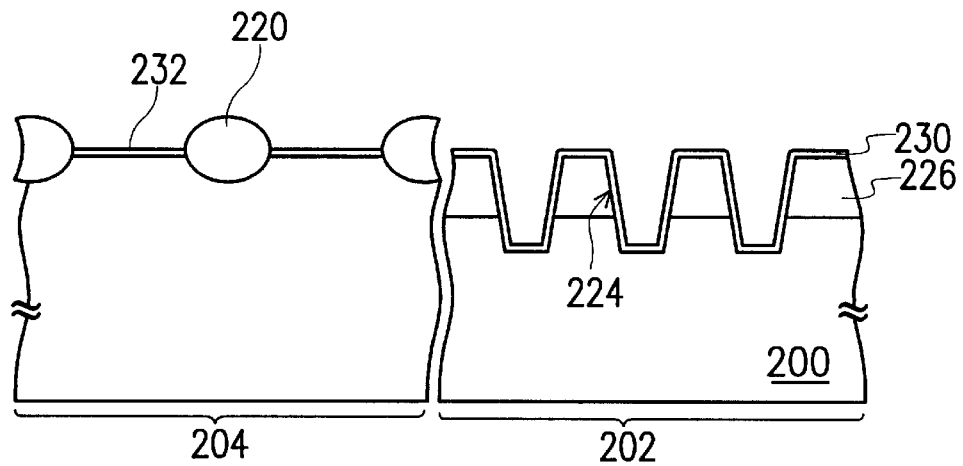

Refer to FIG. 2E, the liner oxide layer 228, the mask layer 216, and the pad oxide layer 214 are sequentially removed. A composite dielectric layer 230 (charge trapping layer) is formed on the memory region 202 and a dielectric layer 232 is formed on the periphery region 204. The composite dielectric layer 230 comprises, for example, a silicon oxide/silicon nitride/silicon oxide (ONO) layer. The dielectric layer 232 comprises, for example, silicon oxide and is formed by a method such as thermal oxidation. The method for fabricating a composite dielectric layer 230 on the memory region 202 and a dielectric layer 232 on the periphery region 204 may comprise the following steps. A first mask layer is formed to cover the memory region 202 and then the dielectric layer 232 is formed on the substrate 200 in the periphery region 204. The first mask layer is then removed. A second mask layer is formed to cover the periphery region 204 and then the composite dielectric layer 230 is formed on the substrate 200 in the memory region 202. The second mask layer is then removed.

Figure 2F:
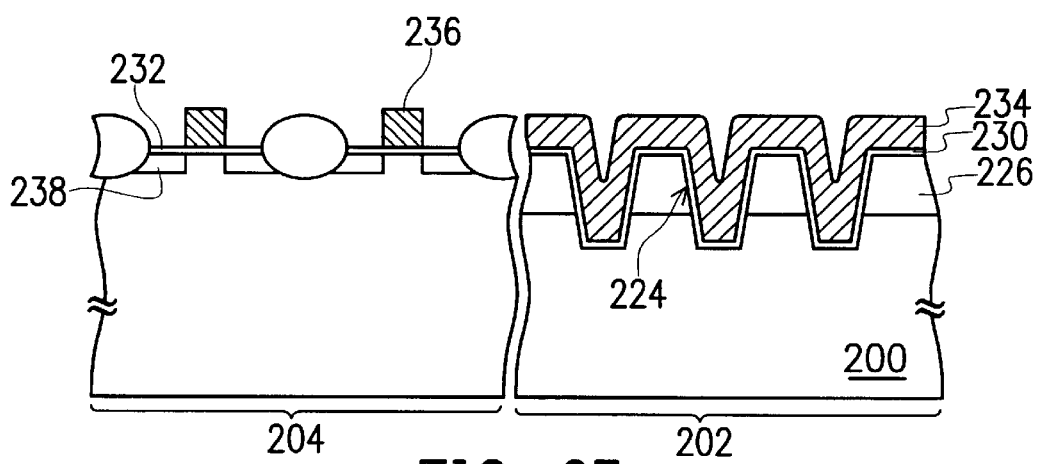

Refer to FIG. 2F, a conductive layer (not shown) is then formed on the substrate 200. The conductive layer comprises, for example, polysilicon and is formed by, for example, chemical vapor deposition with in-situ doping. A lithography process and an etching process are performed to pattern the conductive layer into a plurality of word-lines 234 on the memory region 202 and a plurality of gates 236 on the periphery region 204. Thereafter, a source/drain region 238 is formed in the substrate 200 beside the gate 236 on the periphery region 204. The subsequent back-end process is well-known by those skilled in the art and will not be described here.

In the method of the second embodiment of this invention, the distorted lattice of the substrate 200 is rearranged with a thermal oxidation process after the trench 224 is formed and after the photoresist layer 222 is removed. The defects in the channel regions thus is reduced and a leakage is prevented.

Structure of the NROM

The structure of the NROM according to the second embodiment of this invention will be described below.

Refer to FIG. 2F, the non-volatile memory comprises a substrate 200, a plurality of buried bit-lines 226, a plurality of word-lines 234, and a charge trapping layer 230. The buried bit-lines 226 are located in a substrate 200 and are separated by a plurality of trenches 224. The word-lines 234 are disposed on a portion of the substrate 200 and the trenches 224 and crosses over the trenches 224 and the buried bit-lines 226. The charge trapping layer 230 is between the substrate 200 and the word-lines 234.

Since the buried bit-lines 226 are separated by the trenches 224 in the NROM of this invention, a deeper junction can be formed to lower the resistance of the buried bit-lines 226 and thereby to lower the bit-line loading without worrying the short channel effect and the punch-through leakage.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a mask read-only memory (Mask ROM), comprising the steps of:

forming a planar doped region in a substrate;

forming a mask layer and a first patterned photoresist layer on the substrate;

forming a plurality of trenches in the substrate by patterning the mask layer and the substrate with the first patterned photoresist layer as a mask to divide the planar doped region into a plurality of buried bit-lines;

removing the first patterned photoresist layer;

removing the mask layer;

forming a gate dielectric layer on the substrate;

forming a plurality of word-lines on the gate dielectric layer, wherein one portion of a bottom of each trench covered by one word-line serves as one coding region;

forming a second patterned photoresist layer over the substrate, the second patterned photoresist layer having a plurality of openings over selected coding regions; and performing an ion implantation with the second patterned photoresist layer as a mask to form a plurality of doped coding regions from the selected coding regions.

2. The method of claim 1, further comprising performing a recovering process to recover side-walls and bottoms of the trenches from damages caused by the step of forming the trenches.

3. The method of claim 2, wherein the recovering process comprises:

performing a thermal oxidation process to form a liner oxide layer on the trenches with the mask layer as a mask; and removing the liner oxide layer.

4. The method of claim 1, wherein the gate dielectric layer comprises silicon oxide.

5. The method of claim 1, wherein the mask layer comprises silicon nitride.

6. The method of claim 1, further comprising forming a pad oxide layer on the substrate before the mask layer is formed on the substrate.

7. The method of claim 1, wherein the method for forming the planar doped region comprises ion implantation.

* * * * *